United States Patent [19]
Aoyama et al.

[11] Patent Number: 5,475,321
[45] Date of Patent: Dec. 12, 1995

[54] PROGRAMMABLE LOGIC DEVICE HAVING INPUT TRANSITION DETECTOR CIRCUIT

[75] Inventors: Takuma Aoyama; Akira Takiba, both of Kawasaki, Japan

[73] Assignee: Kabushiki Kaisha Toshiba, Kawasaki, Japan

[21] Appl. No.: 267,910

[22] Filed: Jul. 6, 1994

[30] Foreign Application Priority Data

Jul. 7, 1993 [JP] Japan ................................. 5-167878

[51] Int. Cl.⁶ ........................... G06F 7/38; H03K 19/173
[52] U.S. Cl. ................................................ 326/46; 326/39
[58] Field of Search .................................. 326/39, 44, 93, 326/46

[56] References Cited

U.S. PATENT DOCUMENTS

| | | | |
|---|---|---|---|
| 4,438,350 | 3/1984 | Shepter | 307/440 |
| 4,893,033 | 1/1990 | Itano et al. | 307/465 |
| 5,057,712 | 10/1991 | Trinh et al. | 307/465 |
| 5,105,388 | 4/1992 | Itano et al. | 365/189.08 |
| 5,204,555 | 4/1993 | Graham et al. | 307/465 |
| 5,306,963 | 4/1994 | Leak et al. | 307/443 |
| 5,327,394 | 7/1994 | Green et al. | 365/233.5 |

OTHER PUBLICATIONS

Y. Saeki et al., "32nd Midwest Symposium on Circuits and Systems"; Aug. 14, 1989; pp. 1061–1065.

*Primary Examiner*—Edward P. Westin
*Assistant Examiner*—Stephen Caldoero
*Attorney, Agent, or Firm*—Banner & Allegretti, Ltd.

[57] ABSTRACT

The present invention provides a feedback control circuit for controlling the operation of an sense amplifier circuit in accordance with the feedback of an output signal to the AND array, for a PLD having an ITD circuit. The feedback control circuit includes a storage element for storing data as to whether or not an output signal is fed back to the AND array, and a read-out circuit for reading out the data of the storage element. With the data read out from the storage element, a pulse signal output from the ITD circuit for detecting a change in the output signal is supplied to the sense amplifier circuit so as to set it in an enable state when the output signal is fed back to the AND array, and the supply of the pulse signal to the sense amplifier circuit is inhibited so as to set it in the disable state when the output signal is not fed back to the AND array.

29 Claims, 11 Drawing Sheets

PROGRAMMABLE LOGIC DEVICE HAVING INPUT TRANSITION DETECTOR CIRCUIT

BACKGROUND OF THE INVENTION

1. Field of the Invention

The present invention relates to a semiconductor integrated circuit, and more specifically, to a programmable logic device (PLD) having an input transition detector (ITD) circuit.

2. Description of the Related Art

A PLD is a logic LSI circuit manufactured by utilizing the fact that a logic circuit can be set up by the AND-OR logic. The PLD has a programmable product term line and a programmable sum term line, and the user can set up, by programming, an arbitrary logic circuit in a chip. More specifically, an arbitrary logic output can be obtained from an output pin in accordance with an input signal supplied from an input pin, and if necessary, the logic output can be fed back to be used also as an input signal of the product term line. In the PLD, memory elements such as EPROM and $E^2$PROM are used for constituting an arbitrary logic circuit, and a sense amplifier circuit for amplifying an output from the memory elements is provided.

In the meantime, for the purpose of energy-saving of the sense amplifier circuit, there is provided a technique to render the sense amplifier circuit in an enable state only during the period in which a pulse signal having a constant width is output. In order to realize such an operation, an ITD circuit is used. The ITD circuit generates a pulse signal having a constant width upon detection of a variance of the input signal supplied from the input pin. In response to the pulse signal, the sense amplifier is set in the enable state. The PLD having such an ITD circuit is disclosed in, for example, "32ND MIDWEST SYMPOSIUM ON CIRCUITS AND SYSTEMS", University of Illinois at Urbana-Champaign, Aug. 14–16, 1989, pp. 1062–1065, "LOW-POWER CONSUMPTION AND LOW-VOLTAGE OPERATION PLA($L^2$-PLA) USING 1.2 µm DOUBLE POLY-SILICON CMOS $E^2$PROM TECHNOLOGY", Saeki et al.

However, according to the structure disclosed in the preprint of the thesis, a pulse signal is generated upon detection of a change of a signal output from the output pin or the input/output pin, and therefore the pulse signal is generated even in the case where the output signal of the sense amplifier circuit is not used as being fed back to the AND array, thus setting the sense amplifier circuit in an enable state. As a result, an electrical current is consumed even in the case where it is not necessary to set the sense amplifier circuit in the enable state.

SUMMARY OF THE INVENTION

A purpose of the present invention is to provide a semiconductor integrated circuit capable of saving its consuming power.

Another purpose of the invention is to provide a PLD capable of saving its consuming power.

The above purpose of the present invention is achieved by a semiconductor integrated circuit comprising: a first circuit for outputting a pulse signal upon detecting a change of a signal output from one of an output pin and an input/output pin; a second circuit which is set in an enable state in response to the pulse signal; and a third circuit for determining whether or not the pulse signal output from the first circuit will be transmitted to the second circuit.

With such a configuration, a pulse signal output from the first circuit can be selectively made ineffective on the basis of a control by the control signal output from the third circuit, and the power consumption can be saved by setting the second circuit in a disable state when it is unnecessary.

In the case where the semiconductor integrated circuit is a PLD, an ITD circuit and a sense amplifier circuit are used as the first and second circuits. With this configuration, a pulse signal output from the ITD circuit can be selectively made ineffective on the basis of a control by the control signal output from the third circuit, and the power consumption can be saved by setting the second circuit in a disable state while the output signal is not fed back.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
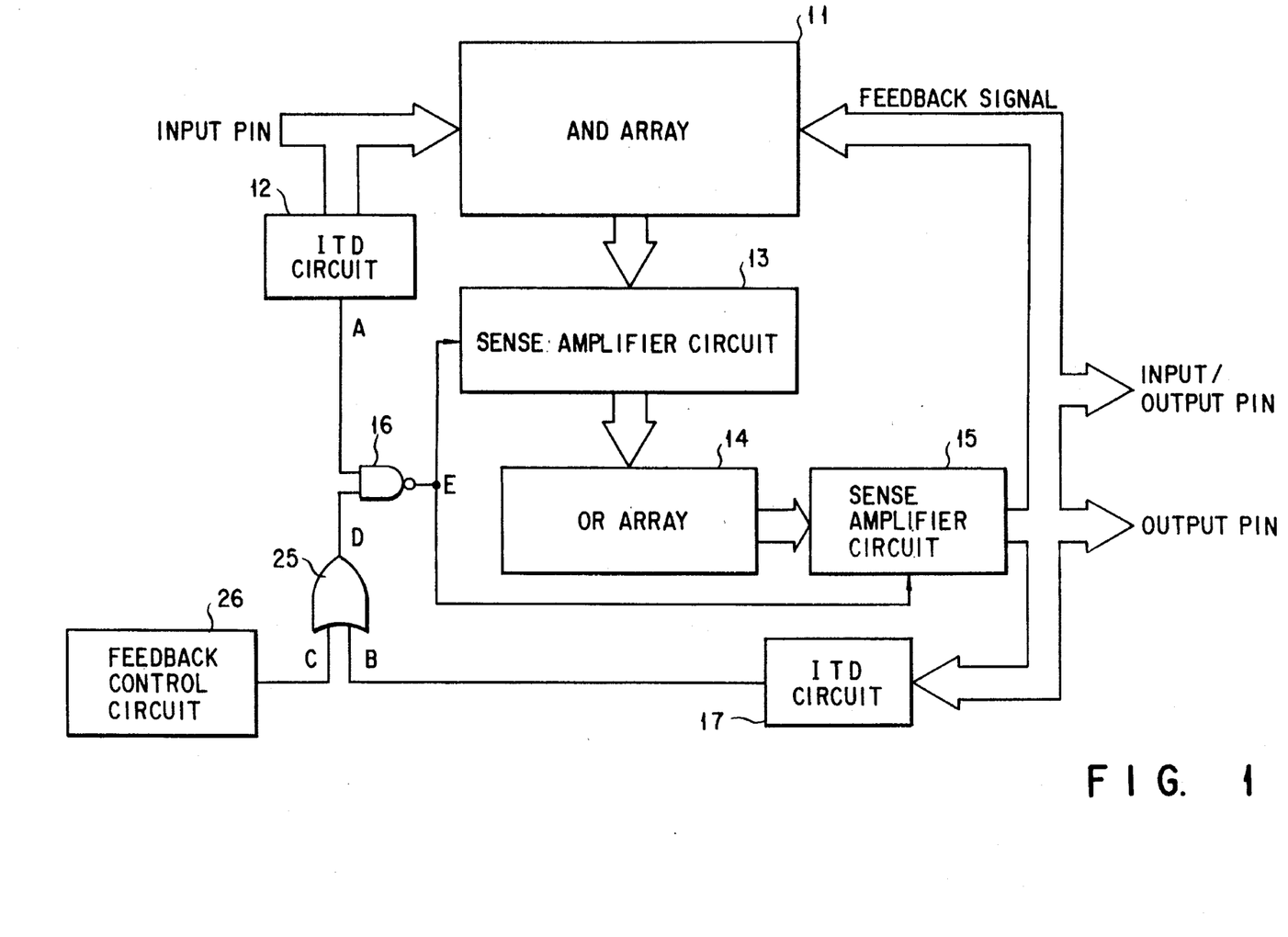
FIG. 1 is a block diagram showing a system configuration of a PLD according to the first embodiment of the present invention.

FIG. 1 is designed to explain a PLD (programmable logic device) according to the first embodiment of the present invention, and is a block diagram showing a basic system configuration of the PLD. An input signal supplied from an input pin is input to a programmable AND array 11 and an ITD (input transition detector) circuit 12. An output from the AND array 11 is sensed and amplified by the sense amplifier circuit 13 and then supplied to the OR array 14, whereas an output from the ITD circuit 12 is supplied to one of the input terminals of a NAND gate 16. The ITD circuit 12 is designed to generate a pulse signal A having a constant width upon detection of a change in the input signal supplied from the input pin. The output from the OR array 14 is sensed and amplified by the sense amplifier circuit 15, and output from an output pin or an input/output pin.

The PLD has a configuration in which the output from the sense amplifier circuit 15 is fed back to the AND array 11 so that it can be used also as an input signal, and therefore a sequential circuit which requires a feedback signal can be constituted. The output signal from the sense amplifier circuit 15 is supplied to the ITD circuit 17, and when a change in the output signal is detected by the ITD circuit 17, a pulse signal B having a constant width is generated and supplied to one of the input terminals of the OR gate 25. The ITD circuit 17 is designed to detect a change in the output signal when feeding back the output signal to the programmable AND array 11 (product term line) as an input signal. To the other input terminal of the OR gate 25, an output signal C of the feedback control circuit 26 is supplied, and a logic sum output D thereof is supplied to the other input terminal of the NAND gate 16. In response to a control signal E output from the NAND gate 16, the sense amplifiers 13 and 15 are each set in an enable state. A desired logic signal in accordance with the programs of the product term line and the sum term line is output from the output pin or the input/output pin.

Figure 2:
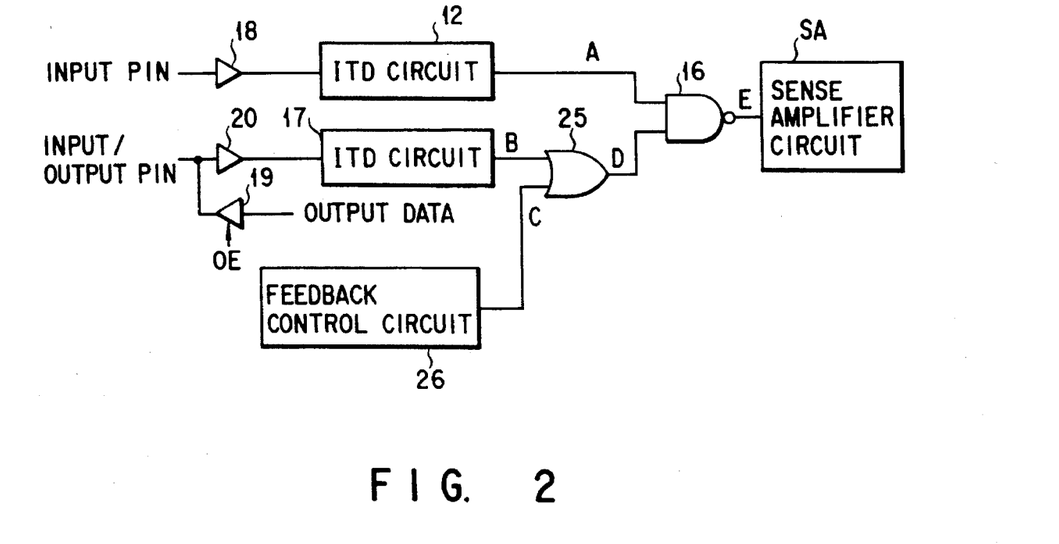
FIG. 2 is a circuit diagram showing extracts from the PLD shown in FIG. 1, namely, the ITD circuit, sense amplifier circuit, feedback control circuit and periphery circuits relating to these circuits.
Figure 3:
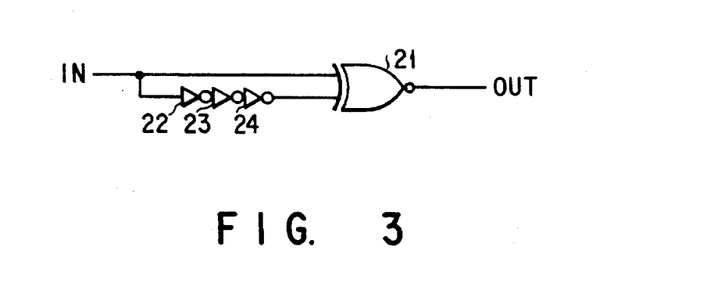
FIG. 3 is a circuit diagram showing an example of the configuration of the ITD circuit used in the circuit shown in FIG. 2.
Figure 4:
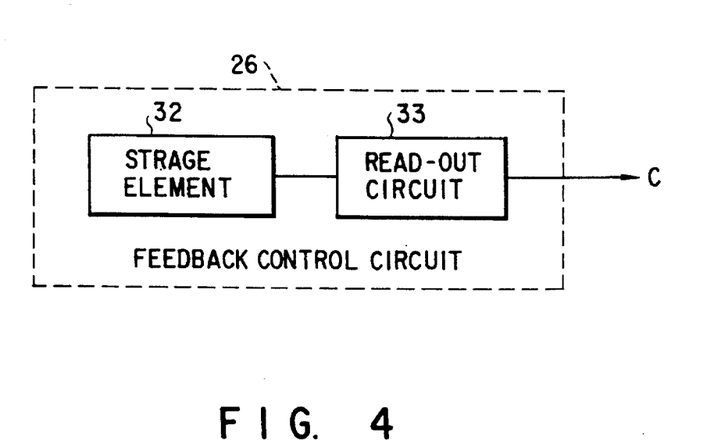
FIG. 4 is a circuit diagram briefly showing an example of the configuration of the feedback control circuit used in the circuit shown in FIG. 2.
Figure 5:
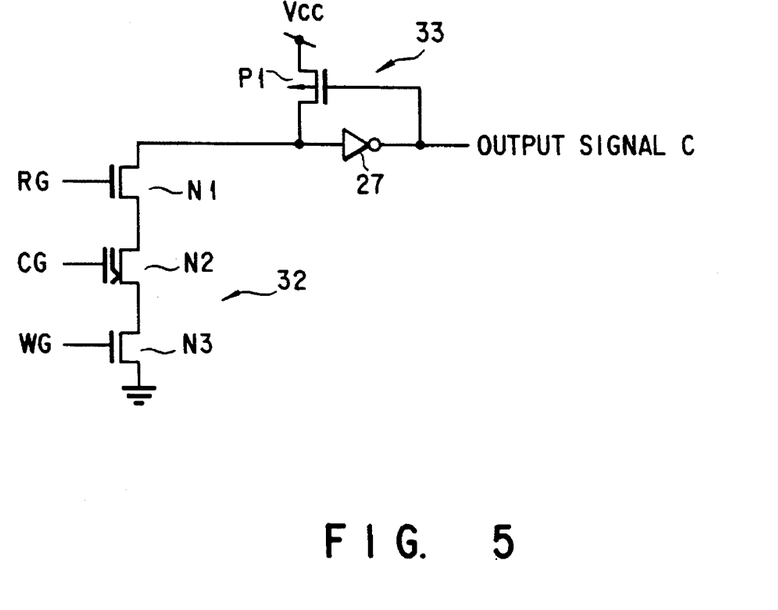
FIG. 5 is a circuit diagram showing an example of the configuration of the feedback control circuit shown in FIG. 4.
Figure 6:
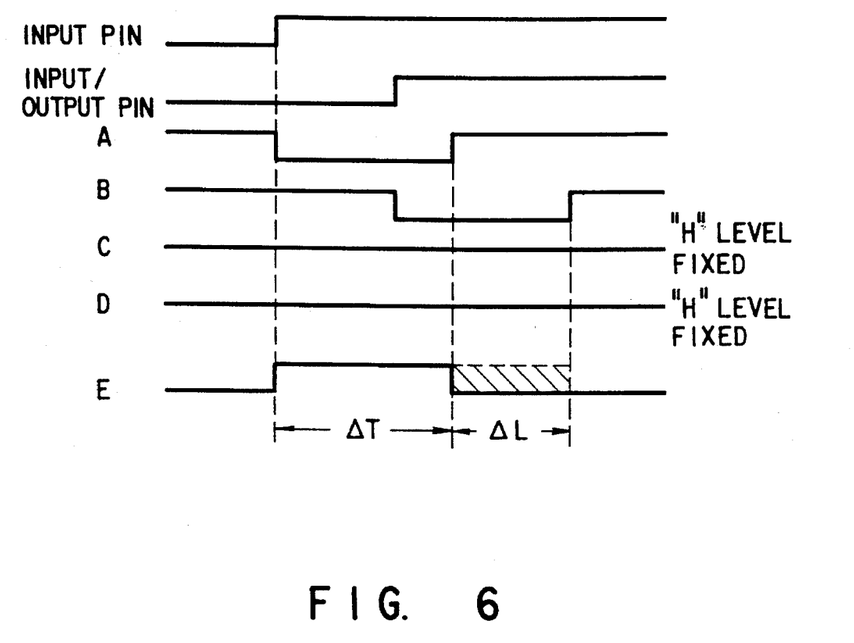
FIG. 6 is a timing chart of each signal in the circuit shown in FIG. 2.

FIG. 2 shows, in detail, extracts from the circuit shown in FIG. 1, namely the ITD circuits 12 and 17, the feedback control circuit 26, the NAND gate 16, the OR gate 25 and the peripheral circuits thereof. FIG. 3 is a circuit diagram showing an example of the configuration of the ITD circuits 12 and 17 in the circuit shown in FIG. 2. FIG. 4 is a circuit diagram briefly showing an example of the configuration of the feedback control circuit used in the circuit shown in FIG. 2. FIG. 5 is a circuit diagram showing an example of the structure of the feedback control circuit shown in FIG. 4. FIG. 6 is a timing chart of each signal in the circuit shown in FIG. 2.

As can be seen in FIG. 2, an input signal supplied from the input pin is supplied to the ITD circuit 12 via a buffer 18, and an output signal (or input signal when the input/output pin is used for inputting a signal) output from a buffer 19 via the output pin or input/output pin is supplied to the ITD circuit 17 via a buffer 20. The ITD circuit 12, upon detection of a change in the input signal, generates a pulse signal A which is partially set at an "L" level for a given period, whereas the ITD circuit 17, upon detection of a change in the output signal (or input signal), generates a pulse signal B which is partially set at an "L" level for a given period. The pulse signal A is supplied to one of the input terminals of the NAND gate 16, whereas the pulse signal B is supplied to one of the input terminals of the OR gate 25. The output signal C of the feedback control circuit 26 is supplied to the other input terminal of the OR gate 25, and the output signal D thereof is supplied to the other input terminal of the NAND gate 16. The feedback control circuit 26 has a memory such as $E^2PROM$, and outputs a signal C of an "H" level or "L" level, depending on the data stored in the $E^2PROM$ in advance. The storage data of the $E^2PROM$ is determined such that the output signal C is set at the "H" level when it is not fed back to the programmable product term line as an input signal, but the signal C is set at the "L" level when it is fed back thereto. Then, the control signal D output from the NAND gate 16 is supplied to the control input terminal of a sense amplifier SA (corresponding to the sense amplifier circuits 13 and 15 shown in FIG. 7), thus controlling the switching operation between the enable state and the disable state. The sense amplifier circuit SA is set in the enable state when the control signal E output from the NAND gate 16 is at the "H" level, but in the disable state (data storage state) when the signal E is at the "L" level. The operation of the buffer 19 is controlled by an OE signal, and the input/output pin serves as an output pin when the buffer 19 is in the enable state, and as an input pin when it is in the disable state.

Each of the ITD circuits 12 and 17 includes, as shown in, for example, FIG. 3, an exclusive NOR gate 21 and inverters 22, 23 and 24. The inverters 22, 23 and 24 serves as a delay circuit for delaying an input signal IN. When the input signal IN changes, the delay circuit outputs a pulse signal OUT (pulse signal A for the ITD circuit 12, and pulse signal B for the ITD circuit 17) which is partially set at the "L" level for a period corresponding to the sum of the delayed times by the inverters 22, 23 and 24. The width of the pulse signal OUT can be varied by changing the number of inverters.

The feedback control circuit 26, as can be seen in FIG. 4, basically consists of a storage element 32 and a read-out circuit 33. In detail, the feedback control circuit 26, as shown in, for example, FIG. 5, consists of a read-out select gate N1, a data storage cell transistor N2, a write-in select gate N3, a pull-up transistor P1 and an inverter 27. The select gate N1, cell transistor N2 and select gate N3 are connected in series between the input terminal of the inverter 27 and the ground. A read-out signal RG, a signal CG and a write-in signal WG are supplied to the gate of the select gate N1, the control gate of the transistor N2 and the gate of the select gate N3, respectively. The select gate N1, the cell transistor N2 and the select gate N3 constitute a so-called 3-transistor-type $E^2PROM$ cell, which corresponds to the storage element 32 in the circuit shown in FIG. 4. The drain and source of the transistor P1 are connected between the input terminal of the inverter 27 and a power supply Vcc, and the gate of the transistor is connected to the output terminal of the inverter 27. The transistor P1 and the inverter 27 serve as a read-out circuit 33 in the circuit shown in FIG. 4. With this configuration, the output signal C of the inverter 27 is supplied to the OR gate 25 shown in FIG. 2.

In the feedback control circuit 26 shown in FIG. 5, in order to read out data, the signals RG and WG are both set at the "H" level, and the signal CG is set at the "L" level. During this period, when data has been already written in the transistor N2 (electrons are released from the floating gate), the select gate N1, the cell transistor N2 and the select gate N3 are all set in an ON state. Therefore, the input terminal of the inverter 27 is set at the "L" level, and the output signal C is set at the "H" level. In contrast, when no data has been written in the cell transistor N2, the cell transistor N2 is in an OFF state. Therefore, the input terminal of the inverter 27 is pulled up to the "H" level by the pull-up transistor P1, and the output signal C of the circuit 26 is set at the "L" level.

The operations of the circuits shown in FIGS. 2 to 5 will be described in detail with reference to the timing chart shown in FIG. 6. First, the case where a signal of the output pin (including the case where the input/output pin is used as an output pin) is fed back to the programmable product term line as an input signal, will be considered. In this case, data is written in the cell transistor N2 so that the output signal C of the feedback control circuit 26 is set at the "L" level. When a change in the input signal is detected by the ITD circuit 12, the pulse signal A which is partially set at the "L" level for a period of ΔT is supplied to the NAND gate 16, and when a change in the input signal is detected by the ITD circuit 17, the pulse signal B which is partially set at the "L" level for a period of ΔT is supplied to the NAND gate 16. Consequently, the control signal E output from the NAND gate 16 is set at the "H" level for a period from the point where the pulse signal A of the ITD circuit 12 falls to the "L" level to the point where the pulse signal B of the ITD circuit 17 rises to the "H" level. During this period, the sense amplifier circuit SA is set in the enable state.

Next, the case where no signal from the output pin is fed back to the programmable product term line as an input signal will be considered. With no signal fed back, no data is written in the cell transistor N2 of the feedback control circuit 26, and therefore the output signal C is set at the "H" level, and the output signal D from the OR gate 25 is fixed at the "H" level. Consequently, even if a change in an output signal is detected and a pulse signal B is output from the ITD circuit 17, the output is not transferred to the NAND gate 16 and the output signal E from the NAND gate 16 will have the same width as that of the pulse signal A generated by the ITD circuit 12 due to a change in the input signal. More specifically, as shown in FIG. 6, the control signal E is set at the "H" level for a period of ΔT from the point where the pulse signal A decreases to the "L" level to the rise of the pulse signal A to the "H" level.

Therefore, in the case where no output signal is fed back and it is not necessary to operate the sense amplifier SA, the enable period of the sense amplifier circuit SA can be shortened by a period of ΔL (which corresponds to the portion indicated by hatching in FIG. 5) from the rise of the pulse signal B from the "L" to "H" level to the rise of the pulse signal B from the "L" to "H" level. Thus, the waste of the current consumption of the sense amplifier circuit SA can be reduced, thereby saving its power consumption.

In the case where the input/output pin is used for input, the pulse signal B of the ITD circuit 17 is supplied to the NAND gate 16 via the OR gate 25 by writing data in the cell transistor N2 so that the output signal C of the feedback control circuit 26 is set at the "L" level. Therefore, the output signal E of the NAND gate 16 is set at the "H" level for a period from the point where the pulse signal A of the ITD circuit 12 falls to the "L" level to the point where the pulse signal B of the ITD signal B rises to the "H" level. During this period, the sense amplifier circuit SA is set in the enable state for operation, thus a normal operation can be carried out.

As already mentioned, when the output signal is not fed back to the AND array 11, the output of the ITD circuit 17 is made ineffective by the feedback control circuit 26 and the OR gate 25 so as to shorten the period of the enable state of the sense amplifier circuit SA, thereby reducing the power consumption.

Figure 7:
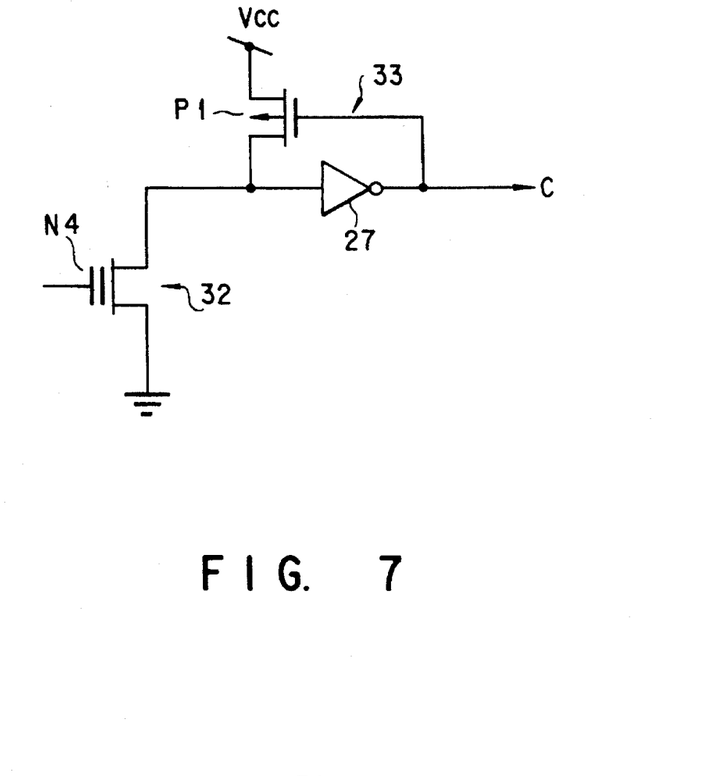
FIGS. 7 and 8 are circuit diagrams each showing another example of the configuration of the feedback control circuit shown in FIG. 4.
Figure 8:
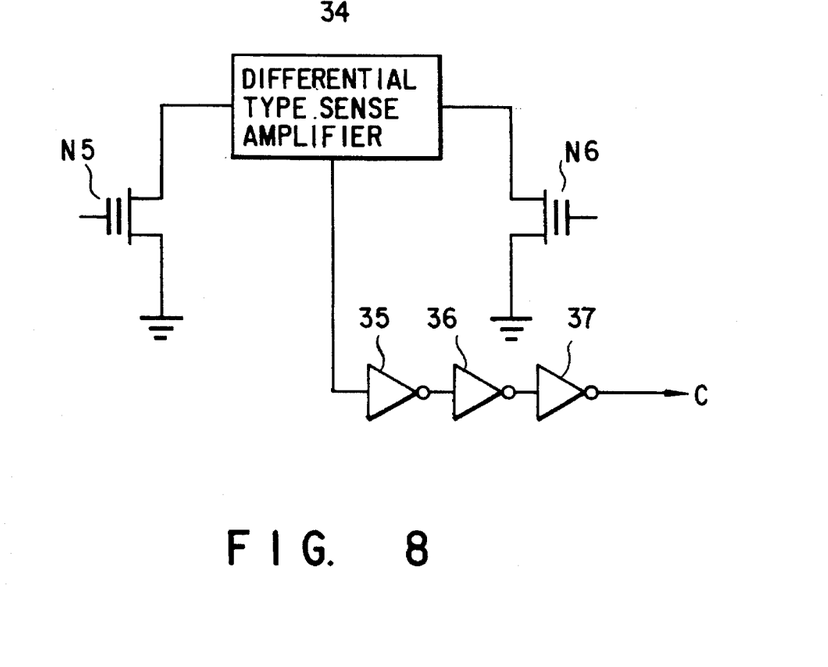

The first embodiment above was described in connection with an example case wherein an E²PROM for storing data relating to whether or not a signal is fed back, is provided in the feedback control circuit 26, and wherein the operation of the sense amplifier circuit SA is controlled with reference to the memory data read out from the E²PROM. However, an EPROM can be used as the memory element 32 as shown in FIGS. 7 and 8. In the circuit shown in FIG. 7, one end of the current path of the cell transistor (EPROM cell) is grounded, and the other end of the path is connected to the input terminal of the inverter 27. The drain and source of the pull-up transistor P1 are connected between the input terminal of the inverter 27 and the power supply Vcc, and the gate of the transistor P1 is connected to the output terminal of the inverter 27. The output signal C of the inverter 27 is supplied to the OR gate 25 shown in FIG. 2. Memory data is written in the cell transistor N4 so that the signal C is set at the "H" level when no output signal is fed back to the programmable product term line as an input signal, but set at the "L" level when the output signal is fed back thereto.

In the circuit shown in FIG. 8, the current path of the cell transistor (EPROM cell) N5 is connected between one of the input terminals of the differential sense amplifier circuit 34 and the ground, and the current path of the cell transistor (EPROM cell) N6 is connected between the other input terminal and the ground. The cell transistor N5 serves as a storage element for controlling the ITD pulse, whereas the cell transistor N6 serves as a dummy cell for generating a potential which is used as a reference in a comparison conducted by the differential type sense amplifier circuit 34. The output of the differential-type sense amplifier circuit 34 is supplied to the OR gate 25 via the inverters 35, 36 and 37. Memory data is written in the cell transistor N5 so that the signal C is set at the "H" level when no output signal is fed back to the programmable product term line as an input signal, but set at the "L" level when the output signal is fed back thereto.

Even with the configuration shown in FIG. 7 or 8, a similar operation to that of the feedback control circuit shown in FIG. 5 is carried out, thus being able to obtain the same effect. Further, it is only natural 10 that some other storage element such as RAM is used as the storage element 32.

Figure 9:
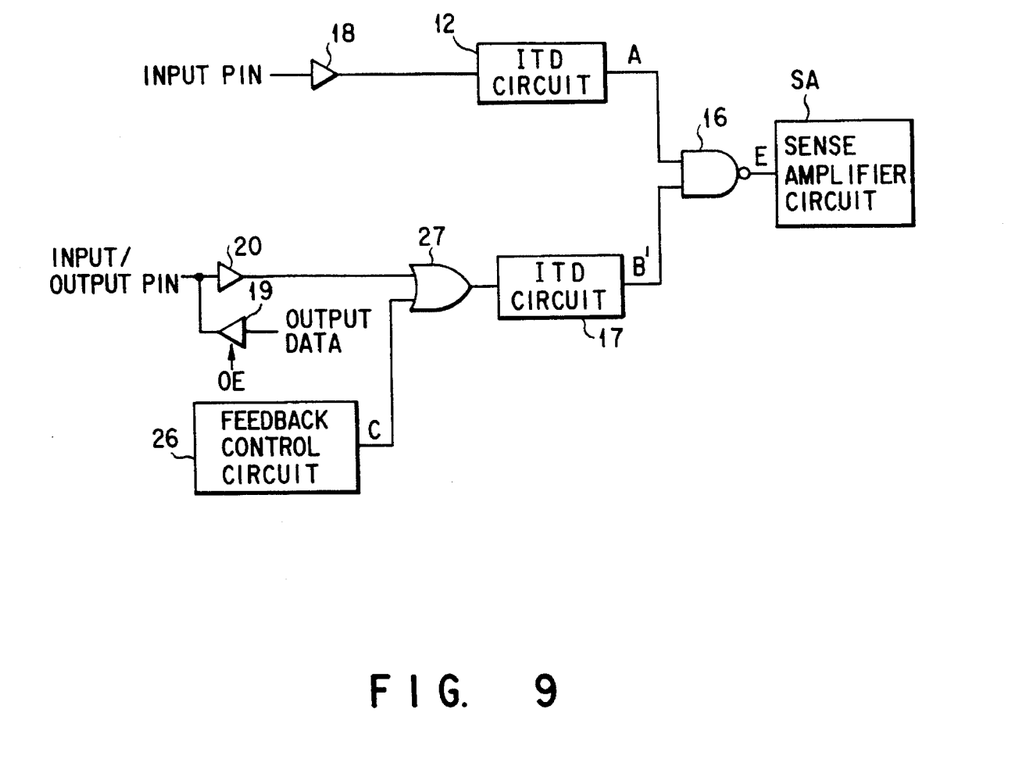
FIG. 9 is a circuit diagram designed for describing the PLD according to the second embodiment of the present invention, showing extracts from the PLD shown in FIG. 1, namely, the ITD circuit, sense amplifier circuit, feedback control circuit and periphery circuits relating to these circuits.

FIG. 9 is designed to explain a PLD according to the second embodiment of the present invention. As can be seen in this figure, whether or not the pulse signal B' is generated or controlled by supplying the output signal C of the feedback control circuit 26 to the input stage of the ITD circuit 17 in the circuit shown in FIG. 2. More specifically, in the first embodiment, the logical sum of the pulse signal B of the ITD circuit 17 and the output signal C of the feedback control signal circuit 26 is obtained by the OR gate 25, and supplied to the NAND gate 16. However, in the circuit shown in FIG. 9, a signal supplied from the buffer 20 and the output signal from the feedback control circuit 26 are supplied to the OR gate 27 to obtained the logical sum thereof, and the output signal of the OR gate 27 is further supplied to the ITD circuit 17.

In the case where the output signal is used by feedback or where the input/output pin is used as input pin, the output signal C of the feedback control circuit 26 is fixed at the "L" level as in the first embodiment. Thus, in response to a change in the output signal from the buffer 20, the pulse signal B' which is set at the "L" level for a given time period is output from the ITD circuit 17. Therefore, the sense amplifier circuit SA is set in the enable state for a period from the point where the pulse signal A output from the ITD circuit 12 falls to the "L" level to the point where the pulse signal B' output from the ITD circuit 17 rises to the "H" level.

Figure 10:
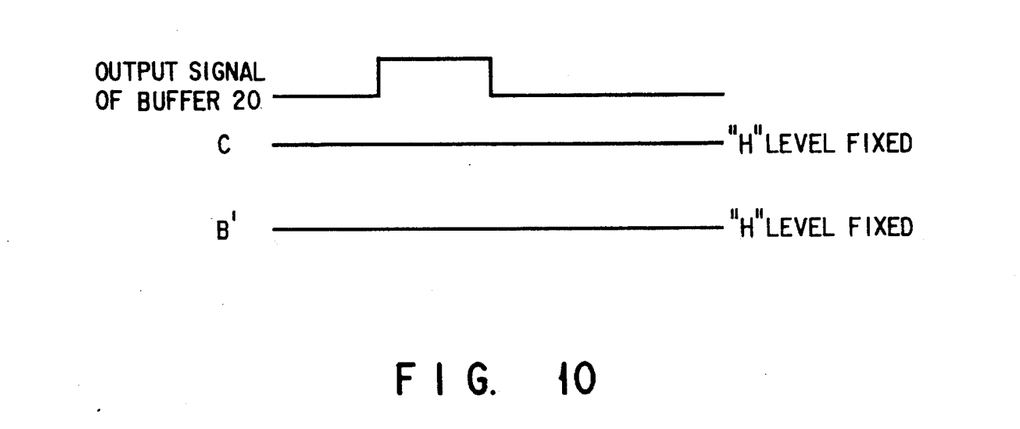
FIG. 10 is a timing chart of each signal in the circuit shown in FIG. 9.

On the other hand, in the case where the output signal is not fed back, the output signal C of the feedback control circuit 26 is fixed to the "H" level as illustrated in the timing chart shown in FIG. 10. Thus, the output signal of the OR gate 27 is fixed at the "H" level regardless of the level of the input signal IN, and therefore the output signal B' of the ITD circuit 17 is fixed at the "H" level. Consequently, the sense amplifier circuit SA is set in the enable state only for a period during which the pulse signal A of the ITD circuit 12 connected to the input pin is set at the "L" level.

As described, with the configuration shown in FIG. 9, a similar operation to that of the PLD of the first embodiment is carried out, and therefore the same effect can be achieved.

Figure 11:
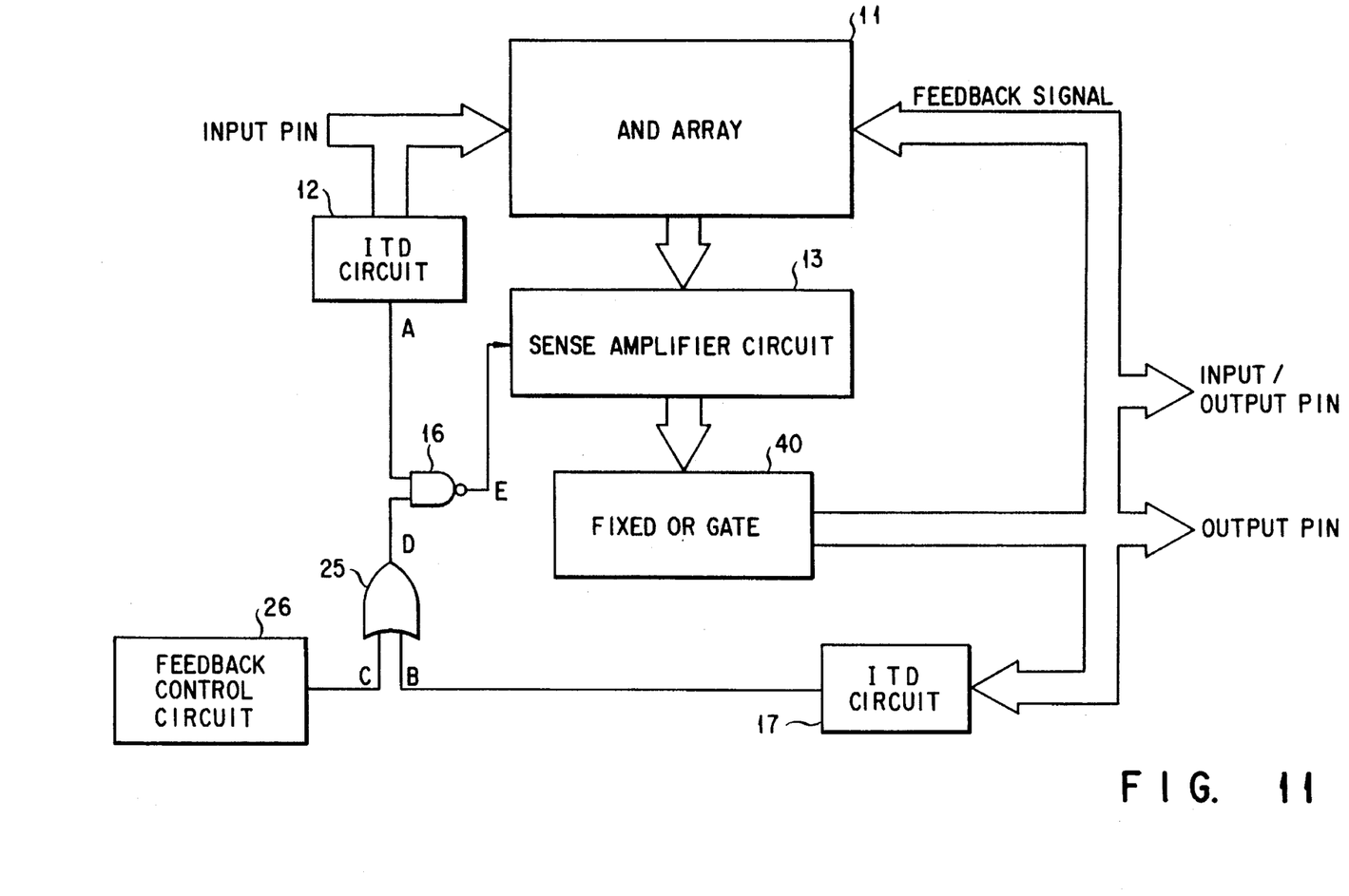
FIGS. 11 to 16 are block diagrams showing system configurations of PLDs according to the third to eighth embodiments, respectively, of the present invention.
Figure 12:
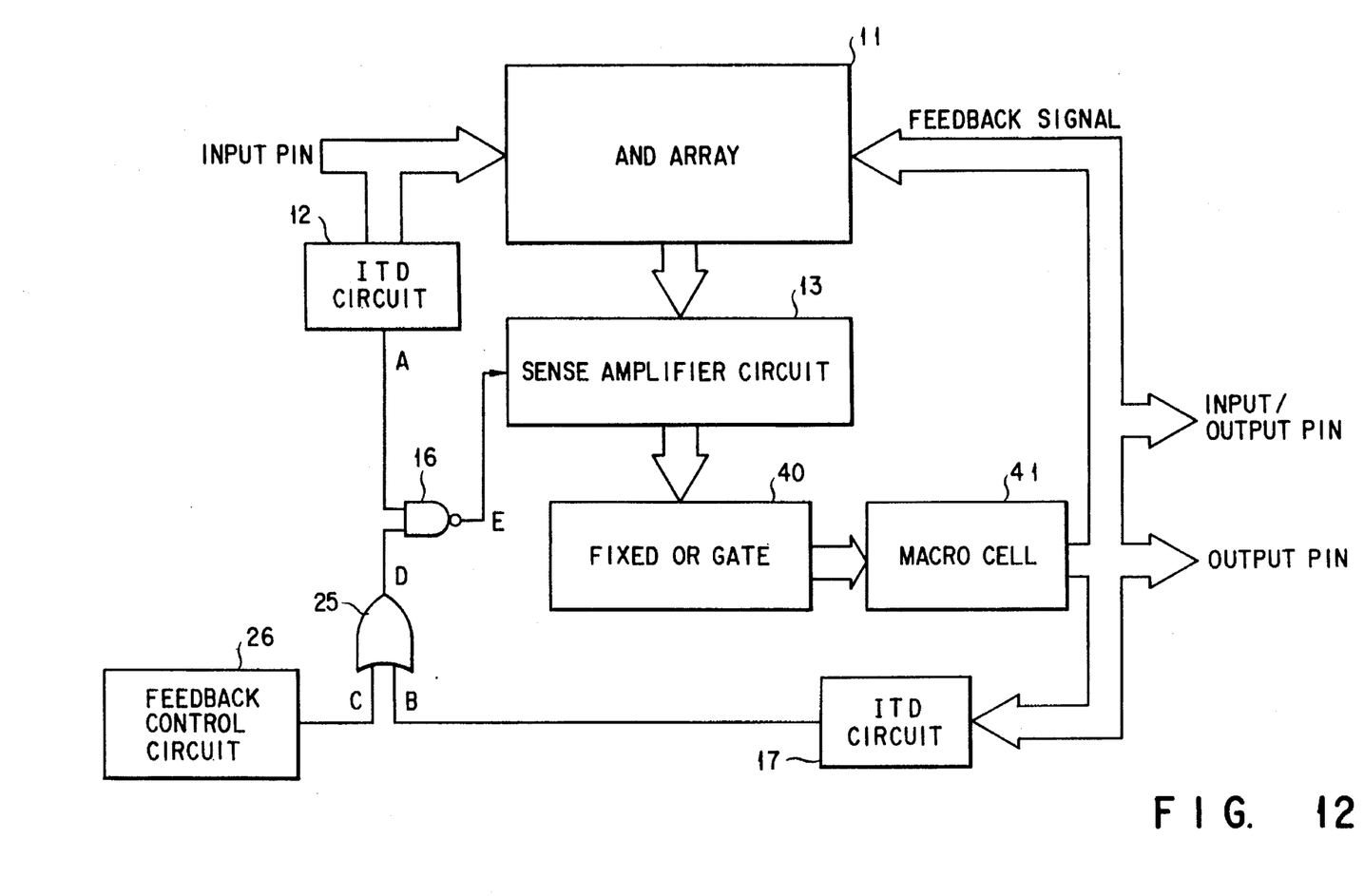

The first and second embodiments were explained in connection with an example case where a double-sided PLD having an AND array and an OR array is used. The present invention, however, is also applicable to a single-sided PLD having an AND array and a fixed OR gate, also known as a PAL-type PLD. FIGS. 11 and 12 are diagrams showing PLDs according to the third and fourth embodiments of the present invention and each illustrates a basic system configuration when the invention is applied to an PAL type. In this system shown in FIG. 11, a fixed OR gate 40 is provided in place of the OR array 14 of the system shown in FIG. 1. The output signal of the fixed OR gate 40 is output from the output pin or the input/output pin, and also fed back to the AND array 11 in accordance with necessity. No sense amplifier circuit 15 is required for the OR array 14. In the system shown in FIG. 12, a macrocell 41 is provided in the circuit shown in FIG. 11, and the output of the fixed OR gate 40 is supplied to the macrocell 41. Then, the output signal of the macrocell 41 is output from the output pin or input/output pin, and also fed back to the AND array 11 in accordance with necessity. The macrocell 41 is, for example, a circuit block which includes polarity control circuit for controlling the polarity of output signals of the fixed OR gate 40, flip-flop circuits, and a multiplexer, and the output mode of an output signal is controlled by selecting polarity control circuit and flip-flop circuits by the multiplexer.

The PAL type PLD is the same as the double-sided PLD except for a part of the logic configuration, and the control of the sense amplifier circuit 13 is carried out by the ITD circuits 12, 17, the feedback control circuit 26, the OR gate 25 (or the OR gate 27) and the NAND gate 16. Therefore, in similar with the cases of the first and second embodiments, the third and fourth embodiments can achieve the saving of the power consumption.

Figure 13:
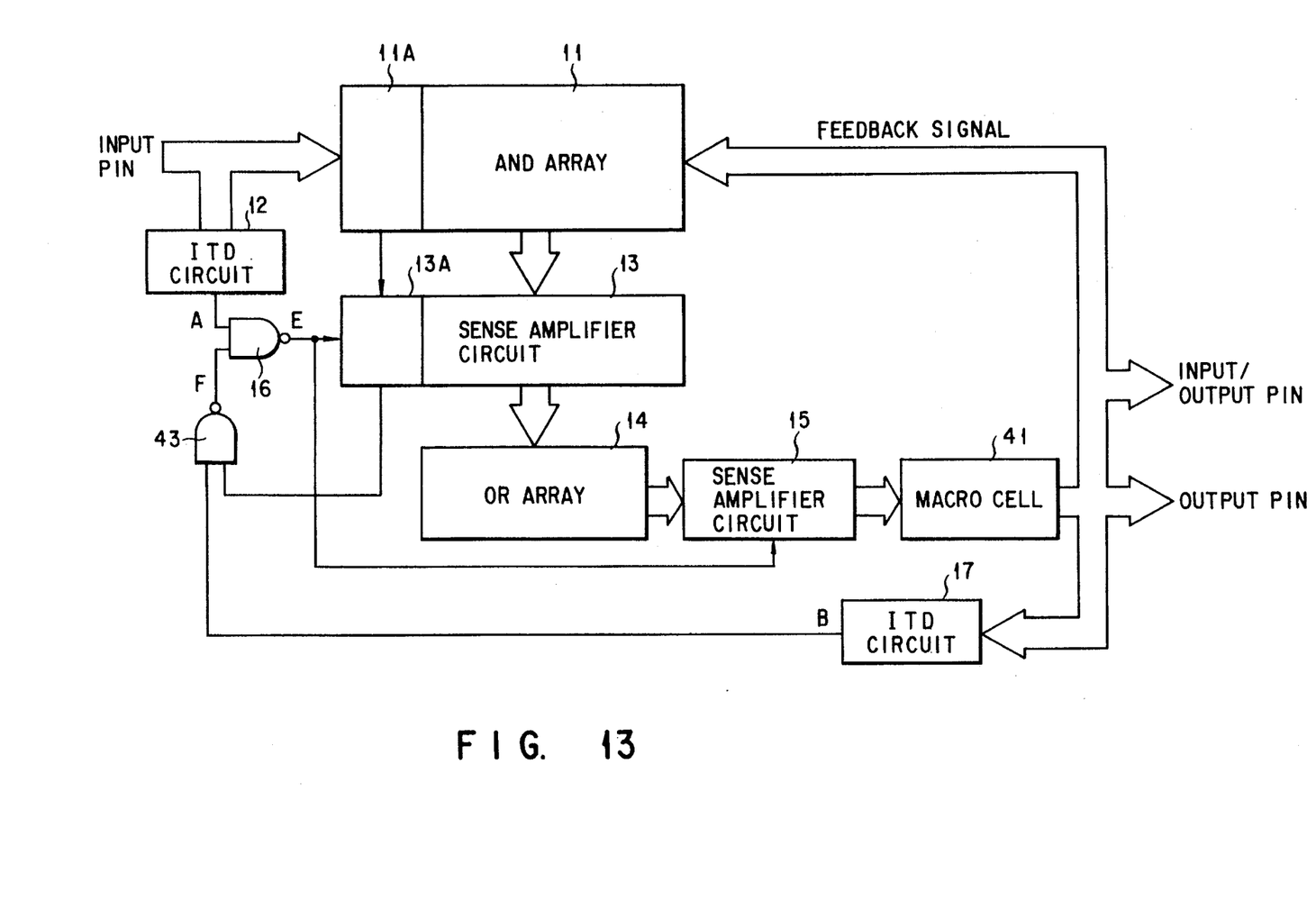

FIG. 13 is a block diagram showing the system configuration of the PLD according to the fifth embodiment of the present invention. In the circuit shown in FIG. 13, a part of the AND array 11 is used as a storage area 11A for controlling ITD pulse, and the storage data stored in the storage area 11A is amplified by a part 13A of the sense amplifier circuit 13 for performing a feedback control. In other words, the function of the feedback control circuit 12 of the circuit shown in FIG. 1 is assigned to the storage area 11A (corresponding to the storage element shown in FIG. 3) of the AND array 11 and the part 13A (corresponding to the read-out circuit 33) of the sense amplifier circuit 13.

The storage data (ITD pulse control data) of the AND array 11A read out by the sense amplifier circuit 13A is supplied to the one of the input terminals of the NAND gate 43. To the other input terminal of the NAND gate 43, the output signal B is supplied, and the output signal F thereof is supplied to the NAND gate 16. The operations of the sense amplifier circuits 13 and 15 are controlled by the output signal E of the NAND gate 16.

With the above-described configuration, the 10 function of the feedback control circuit 26 of each of the aforementioned embodiments can be achieved by the part 11A of the AND array 11 and the part 13A of the sense amplifier circuit 13. Therefore, the data for feedback control can be programmed during the programmings of the AND array 11 and the OR array 14. The other basic operations are the same as those of the other embodiments, and the same effect can be obtained also in this embodiment.

Figure 14:
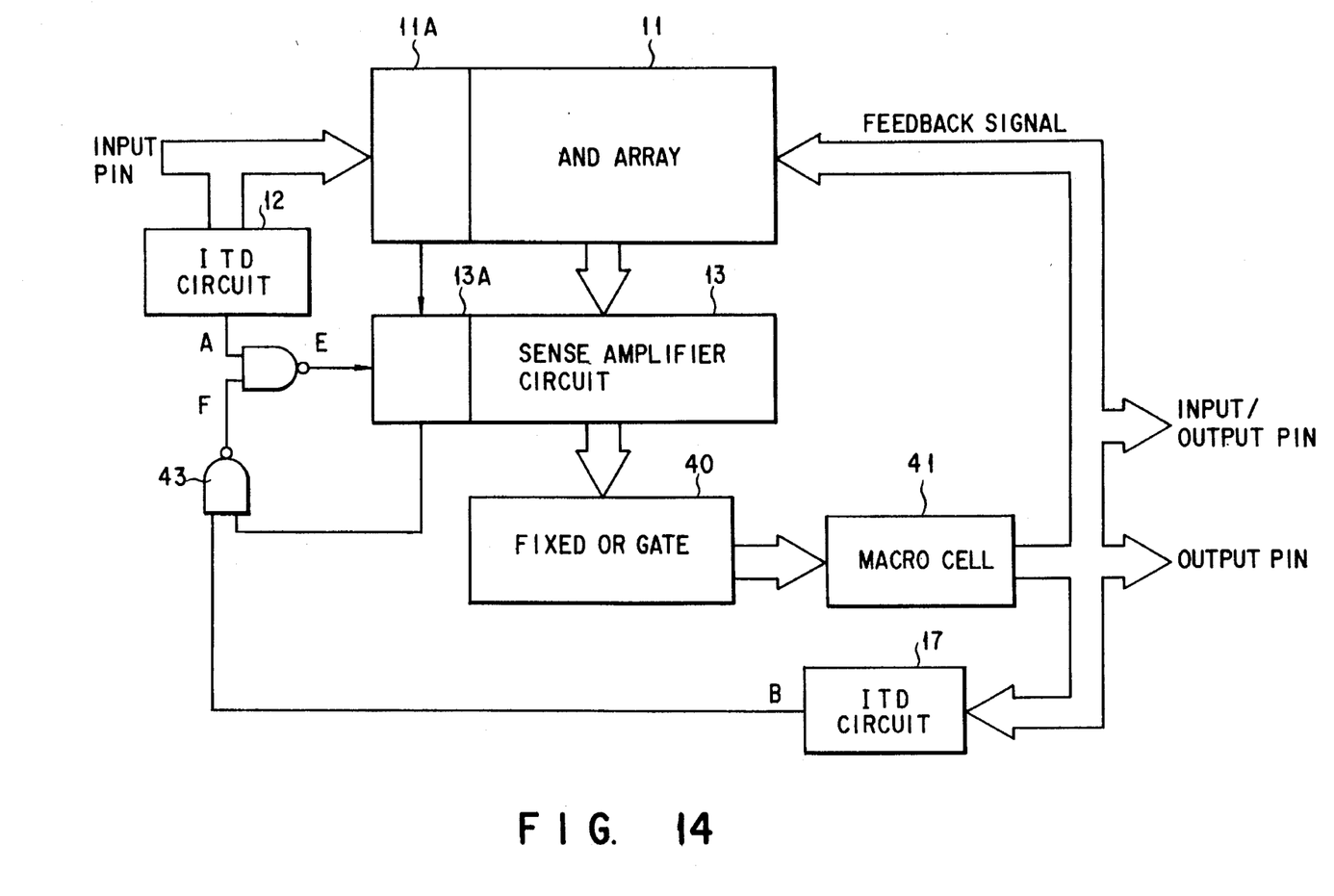

In the circuit shown in FIG. 13, the macrocell 41 is provided for the output terminal of the sense amplifier circuit 15. The macrocell 41 is, for example, a circuit block which includes polarity control circuit for controlling the polarity of output signals of the sense amplifier circuit 15, flip-flop circuits, and a multiplexer, and the output mode of an output signal is controlled by selecting polarity control circuit and flip-flop circuits by the multiplexer. However, the macrocell 41 is not essential to the embodiment, and substantially the same effect can be achieved without it. Further, as shown in FIG. 14, the configuration of this embodiment is also applicable to the PAL-type PLD, and in such case, it only suffices if a fixed OR gate 40 is provided in place of the OR array 14 and the sense amplifier circuit 15.

Figure 15:
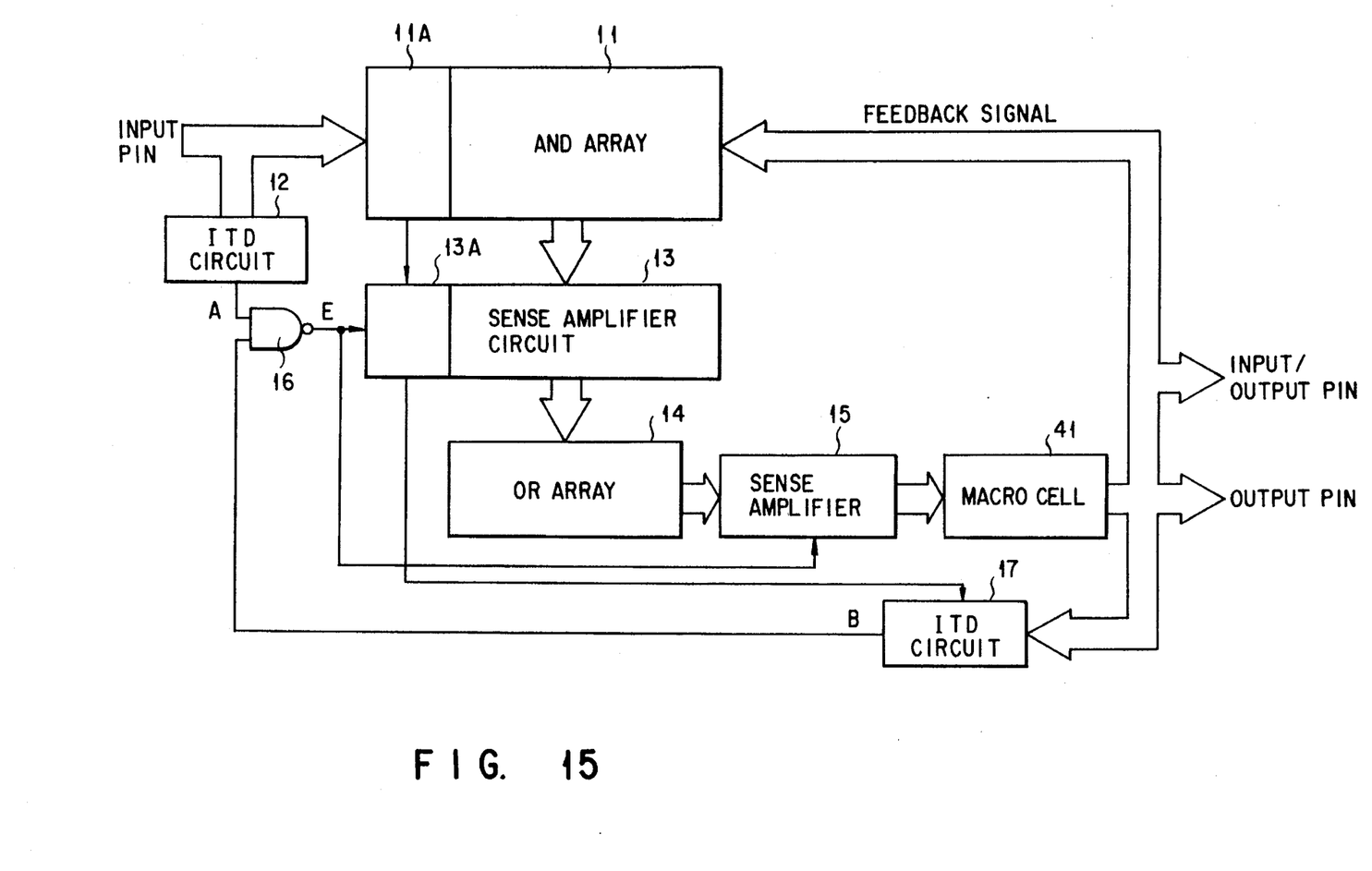

FIG. 15 shows a system configuration of a PLD according to the seventh embodiment of the present invention. This circuit is designed to control the reception of an output signal by supplying the output signal of the sense amplifier circuit 13A in the circuit shown in FIG. 13 to the ITD circuit 17. The output signal B of the ITD circuit 17 is supplied to the NAND gate 16. The rest of the configuration is the same as that of the circuit shown in FIG. 13.

The circuit shown in FIG. 13 is designed to control as to whether or not the output signal B of the ITD circuit 17 is supplied to the NAND gate 16 by the output of the sense amplifier circuit 13A, whereas the circuit shown in FIG. 15 is designed to control the output signal B of the ITD circuit 17 by the output of the sense amplifier circuit 13A. Specifically, in similar to the case of the circuit shown in FIG. 9, it suffices only if an OR gate is provided in the input stage of the ITD circuit 17, the output signal of the buffer 29 is supplied to one of the input terminals thereof, and the output Of the sense amplifier circuit 13A is supplied to the other input terminal so as to output the pulse signal B. With this configuration, the circuit shown in FIG. 15 carries out substantially the same operation as that of the circuit shown in FIG. 13. Thus, the same effect as of the circuit shown in FIG. 13 can be achieved by the configuration shown in FIG. 15.

Figure 16:
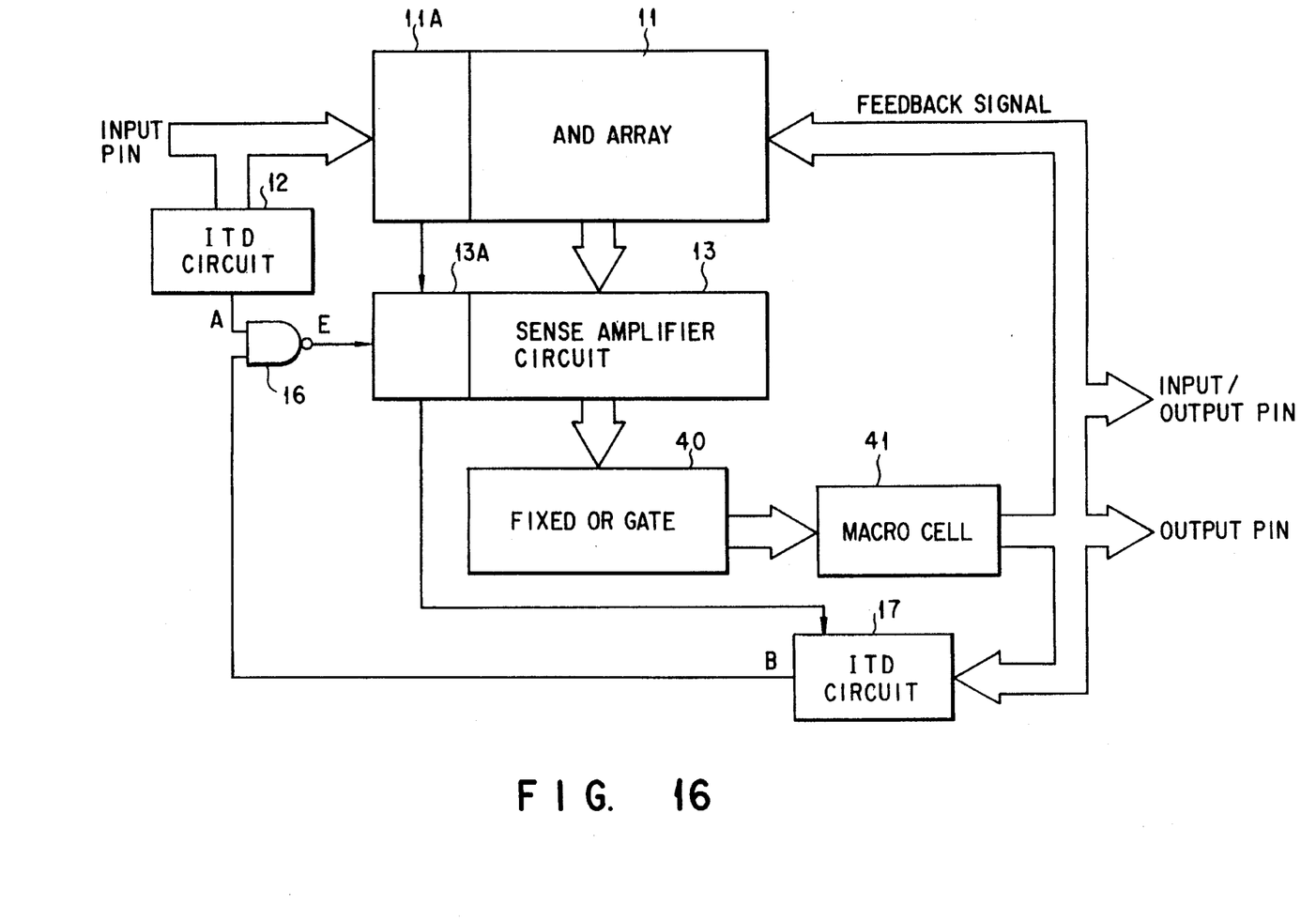

FIG. 16 shows a system configuration of a PLD according to the eighth embodiment of the present 10 invention. This circuit is a PAL-type version of the PLD shown in FIG. 15. This circuit is equivalent to the circuit shown in FIG. 15 when the OR array 14 and the sense amplifier circuit 15 are replaced by an fixed OR gate 40. The basic control operation of the sense amplifier circuit 13 is the same as that of the circuit shown in FIG. 15, and naturally, a similar effect can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
   a first circuit for outputting a pulse signal upon detection of a change in a signal output from one of an output pin and an input/output pin;
   a second circuit which is set in an enable state in response to the pulse signal; and a third circuit having a storage element for storing predetermined data, said third circuit controlling whether or not the pulse signal output from said first circuit is transmitted to said second circuit based on said stored predetermined data.

2. A semiconductor integrated circuit according to claim 1, wherein said third circuit includes at least one storage element, and an output of said third circuit varies on the basis of data stored in said storage element.

3. A semiconductor integrated circuit according to claim 1, wherein said third circuit contains a circuit for controlling whether said input/output pin is used for inputting a signal or outputting a signal.

4. A semiconductor integrated circuit comprising:

a first circuit for outputting a pulse signal in response to a control signal and a change in a signal output from one of an output pin and an input/output pin;

a second circuit which is set in an enable state in response to the pulse signal; and a third circuit which is programmable for controlling whether or not the pulse signal output from said first circuit is transmitted to said second circuit by outputting the control signal to said first circuit.

5. A semiconductor integrated circuit according to claim 4, wherein said third circuit includes at least one storage element, and an output of said third circuit varies on the basis of data stored in said storage element.

6. A semiconductor integrated circuit according to claim 4, wherein said third circuit contains a circuit for controlling whether said input/output pin is used for inputting a signal or outputting a signal.

7. A programmable logic device comprising:

an AND array to which an input signal is supplied;

a first input transition detector (ITD) circuit for outputting a first pulse signal upon detection of a level change in the input signal;

a first sense amplifier circuit for reading out data from said AND array;

an OR array to which an output signal from said first sense amplifier is supplied;

a second sense amplifier circuit for reading out data from said OR array, an output of said second sense amplifier coupled to an input of said AND array;

a second ITD circuit for outputting a second pulse signal upon detection of a level change in an output signal from said second sense amplifier;

logic means for activating said first sense amplifier circuit and said second sense amplifier circuit in response to the first pulse signal output from said first ITD circuit and the second pulse signal output from said second ITD circuit; and control means for controlling said logic means such as to deactivate said first sense amplifier circuit and said second sense amplifier circuit when the output signal of said second sense amplifier circuit is not fed back to said AND array.

8. A programmable logic device according to claim 7, wherein said logic means includes: a NAND circuit having input terminals to one of which the first pulse signal output from said first ITD circuit is supplied; and an OR circuit having input terminals to one of which the second pulse signal output from said second ITD circuit is supplied, and outputting a signal which is supplied to an other input terminal of said NAND circuit; and said control means includes: a storage element for storing data indicating whether or not an output signal of said second sense amplifier circuit will be fed back to said AND array; and a read-out circuit for reading out said data of said storage element and supplying the data to an other input terminal of said OR circuit.

9. A programmable logic device according to claim 7, wherein said logic means includes: a NAND circuit having input terminals to one of which the first pulse signal output from said first ITD circuit is supplied; and said control means includes: a storage element for storing data indicating whether or not an output signal of said second sense amplifier circuit will be fed back to said AND array; a read-out circuit for reading out the data of said storage element; and an OR circuit having input terminals to one of which an output signal from said second sense amplifier circuit is supplied, and to an other of which an output signal of said read-out circuit is supplied, and outputting a signal which is supplied to said second ITD circuit.

10. A programmable logic device according to claim 7, wherein said logic means includes: a first NAND circuit having input terminals to one of which the first pulse signal output from said first ITD circuit is supplied; and a second NAND circuit having input terminals to one of which the second pulse signal output from said second ITD circuit is supplied, and outputting a signal which is supplied to an other input terminal of said first NAND circuit; and said control means includes: a storage area, provided in a sectional region of said AND array, for storing data as to whether or not an output signal of said second sense amplifier circuit is fed back to said AND array; and a sense amplifier portion, provided in a sectional region of said first sense amplifier circuit, for reading out the data of said storage area so as to supply the data to an other input terminal of said second NAND circuit.

11. A programmable logic device according to claim 7, wherein said logic means includes: a first NAND circuit having input terminals to one of which the first pulse signal output from said first ITD circuit is supplied, and to an other of which the second pulse signal output from said second ITD circuit is supplied; and said control means includes: a storage area, provided in a sectional region of said AND array, for storing data as to whether or not an output signal of said second sense amplifier circuit is fed back to said AND array; and a sense amplifier portion, provided in a sectional region of said first sense amplifier circuit, for reading out the data of said storage area so as to control the second pulse signal output from said second ITD circuit.

12. A programmable logic device comprising:

an AND array to which an input signal is supplied;

a first ITD circuit for outputting a first pulse signal upon detection of a level change in said input signal;

a sense amplifier circuit for reading out data from said AND array;

a fixed OR circuit to which an output signal from said sense amplifier circuit is supplied;

a macrocell to which data output from said fixed OR circuit is supplied, an output of said macrocell coupled to an input of said AND array;

a second ITD circuit for outputting a second pulse signal upon detection of a level change in an output signal from said macrocell;

logic means for activating said sense amplifier circuit in response to the first pulse signal output from said first ITD circuit and the second pulse signal output from said second ITD circuit; and control means for controlling said logic means so as to deactivate said sense amplifier circuit when the output signal of said macrocell is not fed back to said AND array.

13. A programmable logic device according to claim 12, wherein said logic means includes: a NAND circuit having input terminals to one of which the first pulse signal output from said first ITD circuit is supplied; and an OR circuit having input terminals to one of which the second pulse signal output from said second ITD circuit is supplied, and outputting a signal which is supplied to an other input terminal of said NAND circuit; and said control means includes: a storage element for storing data as to whether or not an output signal of said macrocell will be fed back to said AND array; and a read-out circuit for reading out said data of said storage element and supplying said data to an other input terminal of said OR circuit.

14. A programmable logic device according to claim 12, wherein said logic means includes: a NAND circuit having input terminals to one of which the first pulse signal output from said first ITD circuit is supplied; and said control means includes: a storage element for storing data as to whether or not an output signal of said macrocell will be fed back to said AND array; a read-out circuit for reading out the data of said storage element; and an OR circuit having input terminals to one of which an output signal from said macrocell is supplied, and to an other of which an output signal from said read-out circuit is supplied, and outputting a signal which is supplied to said second ITD circuit.

15. A programmable logic device according to claim 12, wherein said logic means includes: a first NAND circuit having input terminals to one of which the first pulse signal output from said first ITD circuit is supplied; and a second NAND circuit having input terminals to one of which said second pulse signal output from said second ITD circuit is supplied, and outputting a signal which is supplied to an other input terminal of said first NAND circuit; and said control means includes: a storage area, provided in a sectional region of said AND array, for storing data as to whether or not an output signal of said macrocell is fed back to said AND array; and a sense amplifier portion, provided in a sectional region of said sense amplifier circuit, for reading out the data of said storage area so as to supply the data to an other input terminal of said second NAND circuit.

16. A programmable logic device according to claim 12, wherein said logic means includes: a NAND circuit having input terminals to one of which the first pulse signal output from said first ITD circuit is supplied, and to an other of which said second pulse signal output from said second ITD circuit is supplied; and said control means includes: a storage area, provided in a sectional region of said AND array, for storing data as to whether or not an output signal of said macrocell is fed back to said AND array; and a sense amplifier portion, provided in a sectional region of said sense amplifier circuit, for reading out the data of said storage area so as to control the second pulse signal output from said second ITD circuit.

17. A programmable logic device comprising:

an AND array having a programmable product term line and supplied with an input signal;

a first ITD circuit supplied with said input signal and outputting a first pulse signal upon detection of a level change in said input signal;

a first sense amplifier circuit for amplifying an output signal from said AND array;

an OR array having a programmable sum term line and supplied with an output signal from said first sense amplifier circuit;

a second sense amplifier circuit for amplifying and outputting an output signal from said OR array;

a feedback circuit for coupling an output from said second sense amplifier circuit to an input of said AND array;

a second ITD circuit for outputting a second pulse signal upon detection of a level change in an output signal from said second sense amplifier circuit;

a control circuit for outputting a control signal as to whether or not the output signal from said second sense amplifier circuit will be fed back to said AND array by said feedback circuit; and a logical circuit for, in response to the control signal output from said control circuit, setting said first and second sense amplifier circuits in an enable state for a time period during which the first and second pulse signals are output from said first and second ITD circuits, when the output signal from said second sense amplifier is fed back to said AND array, and setting said first and second sense amplifier circuits in an enable state for a period of time during which the first pulse signal is output from said first ITD circuit, when the output signal from said second sense amplifier circuit is not fed back to said AND array.

18. A programmable logic device according to claim 17, wherein said control means includes: a storage element for storing data as to whether or not an output signal of said second sense amplifier will be fed back to said AND array; and a read-out circuit for reading out the data of said storage element; and said logic circuit includes: an OR gate having input terminals to one of which an output signal of said read-out circuit is supplied and to an other of which an output signal of said second ITD circuit is supplied; and a NAND circuit having input terminals to one of which an output signal from said first ITD circuit is supplied, and to an other of which an output signal of said OR gate is supplied.

19. A programmable logic device according to claim 17, wherein said control means includes: a storage element for storing data as to whether or not an output signal of said second sense amplifier circuit will be fed back to said AND array; and a read-out circuit for reading out the data of said storage element; and said logic circuit includes: an OR gate having input terminals to one of which an output signal from said second sense amplifier circuit is supplied, and to an other of which an output signal from said read-out circuit is supplied, and outputting a signal which is supplied to said second ITD circuit; and a NAND circuit having input terminals to one of which the first pulse signal output from said first ITD circuit is supplied, and to an other of which the second pulse signal of said second ITD circuit is supplied.

20. A programmable logic device according to claim 17, wherein said control means includes: a storage area, provided in a sectional region of said AND array, for storing data as to whether or not an output signal of said second sense amplifier circuit is fed back to said AND array; and a sense amplifier portion, provided in a sectional region of said sense amplifier circuit, for reading out the data of said storage area; and said logic means includes: a first NAND gate having input terminals to one of which an output signal of said sense amplifier portion is supplied, and to an other of which an output signal of said second ITD circuit is supplied; and a second NAND gate having input terminals to one of which an output signal of said first ITD circuit is supplied, and to an other of which an output signal of said first NAND gate is supplied, so as to control said first and second sense amplifier circuits.

21. A programmable logic device according to claim 17, wherein said control means includes: a storage area, provided in a sectional region of said AND array, for storing data as to whether or not an output signal of said second sense amplifier circuit is fed back to said AND array; and a sense amplifier portion, provided in a sectional region of said sense amplifier circuit, for reading out the data of said storage area so as to control the second pulse signal output from said second ITD circuit; and said logic means includes: a NAND gate having input terminals to one of which the first pulse signal output from said first ITD circuit is supplied, and to an other of which an output signal of said second ITD circuit is supplied, so as to control said first and second sense amplifier circuits.

22. A programmable logic device comprising:

an AND array having a programmable product term line and supplied with an input signal;

a first ITD circuit supplied with the input signal and outputting a first pulse signal upon detection of a level change in said input signal;

a sense amplifier circuit for amplifying an output signal from said AND array;

a fixed OR circuit supplied with an output signal from said sense amplifier circuit;

a macrocell supplied with an output signal from said fixed OR circuit;

a feedback circuit for coupling an output of said macrocell to an input of said AND array;

a second ITD circuit for outputting a second pulse signal upon detection of a change in an output signal of said macrocell;

a control circuit for outputting a control signal as to whether or not the output signal of said macrocell is fed back to said AND array by said feedback circuit; and a logical circuit for, in response to the control signal from said control circuit, setting said sense amplifier circuit in an enable state for a time period during which the first and second pulse signals are output from said first and second ITD circuits, when the output from said macrocell is fed back to said AND array, and setting said sense amplifier in an enable state for a time period during which the first pulse signal is output to said first ITD circuit, when the output signal from said macrocell is not fed back to said AND array.

23. A programmable logic device according to claim 22, wherein said control circuit includes: a storage element for storing data as to whether or not an output signal of said macrocell is fed back to said AND array; and a read-out circuit for reading out the data in said storage element; and said logic circuit includes: an OR gate having input terminals to one of which an output signal of said read-out circuit is supplied, and to an other of which an output signal of said second ITD circuit is supplied; and a NAND gate having input terminals to one of which an output signal of said first ITD circuit is supplied, and to an other of which an output signal of said OR gate is supplied.

24. A programmable logic device according to claim 22, wherein said control means includes: a storage area, provided in a sectional region of said AND array, for storing data as to whether or not an output signal of said macrocell is fed back to said AND array; and a sense amplifier portion, provided in a sectional region of said sense amplifier circuit, for reading out the data of said storage area; and said logic means includes: a first NAND gate having input terminals to one of which an output signal of said sense amplifier portion is supplied, and to an other of which an output signal of the second pulse signal is supplied; and a second NAND circuit having input terminals to one of which an output signal of said first ITD circuit is supplied, and to an other of which an output signal of said first NAND gate is supplied so as to control said sense amplifier circuit.

25. A programmable logic device according to claim 22, wherein said control means includes: a storage area, provided in a sectional region of said AND array, for storing data as to whether or not an output signal of said macrocell is fed back to said AND array; and a sense amplifier portion, provided in a sectional region of said sense amplifier circuit, for reading out the data of said storage area so as to control the second pulse signal output from said second ITD circuit; and said logic means includes: a NAND gate having input terminals to one of which the first pulse signal output from said first ITD circuit is supplied, and to an other of which an output signal of said second ITD circuit is supplied, so as to control said sense amplifier circuit.

26. A programmable logic device comprising:

an AND array to which an input signal is supplied;

a first ITD circuit for outputting a first pulse signal upon detection of a level change in the input signal;

a first sense amplifier circuit for reading out data from said AND array;

an OR array to which an output signal from said first sense amplifier circuit is supplied;

a second sense amplifier circuit for reading out data from said OR array;

a macrocell to which data is output from said second sense amplifier, said macrocell having an output coupled to an input of said AND array;

a second ITD circuit for outputting a second pulse signal upon detection of a level change in an output signal from said macrocell;

logic means for activating said first sense amplifier circuit and said second sense amplifier circuit in response to the first pulse signal output from said first ITD circuit and the second pulse signal output from said second ITD circuit; and control means for controlling said logic means such as to deactivate said first sense amplifier circuit and said second sense amplifier circuit when the output signal of said macrocell is not fed back to said AND array.

27. A programmable logic device comprising:

an AND array having a programmable product term line and supplied with an input signal;

a first ITD circuit supplied with said input signal and outputting a first pulse signal upon detection of a level change in said input signal;

a first sense amplifier circuit for amplifying an output signal from said AND array;

an OR gate array having a programmable sum term line and supplied with an output signal from said first sense amplifier circuit;

a second sense amplifier circuit for amplifying and outputting an output signal from said OR array;

a macrocell to which data is output from said second sense amplifier circuit;

a feedback circuit for coupling an output from said macrocell to an input of said AND array;

a second ITD circuit for outputting said second pulse signal upon detection of a level change in an output signal from said macrocell;

a control circuit for outputting a control signal as to whether or not the output signal from said macrocell will be fed back to said AND array by said feedback circuit; and a logical circuit for, in response to the control signal output from said control circuit, setting said first and second sense amplifier circuits in an enable state for a time period during which the first and second pulse signals are output from said first and second ITD circuits, when the output signal from said macrocell is fed back to said AND array, and setting said first and second sense amplifier circuits in an enable state for a time period during which the first pulse signal is output from said first ITD circuit, when the output signal from said macrocell is not fed back to said AND array.

28. A programmable logic device comprising:

an AND array to which an input signal is supplied;

a first ITD circuit for outputting a first pulse signal upon detection of a level change in said input signal;

a sense amplifier circuit for reading out said data from said AND array;

a fixed OR circuit to which an output signal from said sense amplifier is supplied, said fixed OR gate having an output coupled to an input of said AND array;

a second ITD circuit for outputting a second pulse signal upon detection of a level change in an output signal from said fixed OR array;

logic means for activating said sense amplifier circuit in response to the first pulse signal output from said first ITD circuit and the second pulse signal output from said second ITD circuit; and control means for controlling said logic means so as to deactivate said sense amplifier circuit when the output signal of said fixed OR circuit is not fed back to said AND array.

29. A programmable logic device comprising:

an AND array having a programmable product term line and supplied with an input signal;

a first ITD circuit supplied with an input signal and outputting a first pulse signal upon detection of a level change in said input signal;

a sense amplifier circuit for amplifying an output signal from said AND array;

a fixed OR circuit supplied with an output signal from said first sense amplifier circuit;

a feedback circuit for coupling an output of said fixed OR circuit to an input of said AND array;

a second ITD circuit for outputting a second pulse signal upon detection of a change in an output signal of said fixed OR circuit;

a control circuit for outputting a control signal as to whether or not the output signal of said fixed OR circuit is fed back to said AND array by said feedback circuit; and a logical circuit for, in response to the control signal output from said control circuit, setting said sense amplifier circuit in an enable state for a time period during which the first and second pulse signals are output from said first and second ITD circuits, when the output signal from said fixed OR circuit is fed back to said AND array, and setting said sense amplifier circuit in an enable state for a time period during which the first pulse signal is output from said first ITD circuit, when the output signal from said fixed OR circuit is not fed back to said AND array.

* * * * *